United States Patent [19]
Besmann et al.

[11] Patent Number: 5,843,533
[45] Date of Patent: Dec. 1, 1998

[54] CVD METHOD OF FORMING SELF-LUBRICATING COMPOSITES

[75] Inventors: Theodore M. Besmann; Peter J. Blau, both of Oak Ridge; Woo Y. Lee, Knoxville; Yong W. Bae, Oak Ridge, all of Tenn.

[73] Assignee: Lockheed Martin Energy Systems, Inc., Oak Ridge, Tenn.

[21] Appl. No.: 537,050

[22] Filed: Sep. 29, 1995

Related U.S. Application Data

[62] Division of Ser. No. 409,580, Mar. 23, 1995, abandoned.

[51] Int. Cl.$^6$ .................................................. C23C 16/00
[52] U.S. Cl. .................................. 427/255.2; 427/255.1; 427/314
[58] Field of Search ........................... 427/255.2, 255.1, 427/314, 253; 252/12; 428/323

[56] References Cited

U.S. PATENT DOCUMENTS 4,975,340  12/1990  Suhr et al. ................................ 428/698
5,252,518  10/1993  Sandhu et al. .......................... 437/200
5,282,985  2/1994  Zabinski et al. .......................... 252/12

OTHER PUBLICATIONS

Pierson, "Handbook of Chemical Vapor Deposition (CVD), Principles, Technology and Applications", Noyes Publications (1992) pp. 135, 136, 225, 252 and 356.

*Primary Examiner*—Roy V. King
*Attorney, Agent, or Firm*—Ivan L. Ericson; Joseph A. Marasco

[57] ABSTRACT

An article having a multiphase composite lubricant coating of a hard refractory matrix phase of titanium nitride dispersed with particles of a solid lubricating phase of molybdenum disulfide is prepared by heating the article to temperatures between 350° and 850° C. in a reaction vessel at a reduced pressure and passing a gaseous mixture of $Ti((CH_3)_2N)_4$, $MoF_6$, $H_2S$ and $NH_3$ over the heated article forming a multiphase composite lubricant coating on the article.

2 Claims, 1 Drawing Sheet

CVD METHOD OF FORMING SELF-LUBRICATING COMPOSITES

This application is a division of application Ser. No. 08/409,580, filed Mar. 23, 1995, now abandoned.

This invention was made with Government support under contract DE-AC05-84OR21400 awarded by the U.S. Department of Energy to Martin Marietta Energy Systems, Inc. and the Government has certain rights in this Invention.

FIELD OF THE INVENTION

The present invention relates to composite coatings and method thereof, more particularly, to composite coatings for low friction and wear applications and method thereof.

BACKGROUND OF THE INVENTION

Multi-phase materials in which at least one phase is a solid or liquid lubricant are called self-lubricating materials or self-lubricating composites. Self-lubricating materials are an important class of low friction and wear-resistant materials (also referred to as "tribomaterials"). Some of the earliest examples of self-lubricating materials are "porous bearings" usually composed of bronze with oil-filled pockets. Most polymer-based bearing materials are mixtures of thermoplastics with polytetrafluoroethylene, silicones, or graphite which serve as the lubricating phases.

Solid lubricants have higher use temperatures and higher load-bearing capacities than do liquid lubricants. Consequently, they find use in applications where liquid lubricants prove inadequate. For example, they are sometimes applied to "permanently lubricate" inaccessible parts of a machine. In short-term use applications, such as disposable machinery (e.g., missiles or torpedoes) solid lubricants may work very well owing to long shelf-life and low flammability ratings. Solids are sometimes used when the vaporization of a liquid lubricant might cause problems (e.g., for lubricating bearings in an orbiting spacecraft with exposed optical surfaces nearby). They are frequently used in metalworking operations such as wire-drawing, forging, rolling, and extrusion.

Solid lubricants and solid lubricant-containing materials are often the only means to provide the friction reduction necessary for the diverse applications which range from dies for metal extrusion to high-speed bearings in missile guidance systems. In all cases, the applications involve transportation systems, either military or civilian. Historically, tribology has been linked to the evolution of transportation technology. While the development of an "adiabatic diesel" may no longer be an engineering goal, the ring/cylinder liner tribosystem certainly remains an important area for improvement. Other applications such as valve stems, valve guides, and roller-followers could also benefit from composite solid-lubricant systems. Thus, it is clear that solid lubrication technology has broad applications.

The difficulty with existing solid lubricants is the fact that they rapidly are worn away and thus require some mechanical means for replenishment. This is impractical in many moving systems, and thus high-temperature systems must either suffer without lubrication or be operated and less than optimal temperatures. In addition, good solid lubricants such as graphite, are unstable in high temperature oxidative atmospheres. An inherently lubricated, wear surface with a degree of oxidation resistance, that is usable to elevated temperature would overcome this problem.

Recent years have witnessed a number of attempts at developing high-temperature, self-lubricating coatings. Notable among these are the so-called PS-200 series of plasma-sprayed coatings developed by NASA, DellaCort, C. and Sliney, H. (1986), "Composition Optimization of Self-Lubricating Chromium Carbide-Based Composite Coatings for Use at 760° C.," ASLE Trans., Vol. 30(1) p. 77. These are composed of a complex combination of $BaF_2/CaF_2$ eutectic, Ag, and $Cr_3C_2$ which serves as the supporting phase. The Ag is used for low-temperature lubrication (to about 400°–500° C.) and the eutectic for elevated temperature lubrication (up to about 900° C.). Thick, plasma-sprayed self-lubricating coatings, however, are generally highly porous, and are very difficult to control in terms of thickness and homogeneity of the second phase particle distributions. In contrast, the subject invention uses chemical vapor deposition (CVD) techniques and allows direct control of composition via gas phase composition control, thus permitting tailoring of the ratio of the constituents for appropriate hardness, wear, and friction. In addition, the CVD coatings can be thinner, adhere better to the substrate, and can be applied to complex shapes since they do not require line-of-sight application.

Work toward producing low-friction composites with $Si_3N_4$ matrices is also being reported by Blanchard, R. C. and Page, A. R. (1990), "Effect of Silicon Carbide Whisker and Titanium Carbide Particulate Additions on the Friction and Wear Behavior of Silicon Nitride," J. Amer. Ceram. Soc., Vol. 73(11), p. 3442. Investigators have proposed that the oxidation of the TiC to form lubricous titanium oxides is a promising approach in SiC whisker-reinforced composites containing TiC. Encouraging results have been obtained in friction tests conducted between 700° and 900° C. These materials must be produced by conventional ceramic forming methods (press and sinter, hot-pressing, slip-casting, etc.). Thus they result in ceramic composite bodies and cannot be applied as coatings to surfaces.

Current efforts of Erdemir A., Fenske G. R., Erck R. A. and Cheng C. C. have also included ion-implantation and ion-assisted deposition. Erdemir A., Fenske G. R., Erck R. A. and Cheng C. C. (1989) "Ion Assisted Deposition of Silver Films on Ceramics for Friction and Wear Control," STLE Preprint 89-AM-5C-1.

The problem with many of the implantation or ion-beam techniques is that the implanted layers tend to be of the order of 0.1 μm in thickness and the effects of lubrication tend to be short-term, lasting only long enough to be demonstrated in carefully-controlled, laboratory experiments. Ion-implanted surfaces may also require very costly, careful preparation. In the proposed invention the coatings can be produced to any thickness, and the CVD process is known to be substantially less costly than ion-implantation.

A compendium of commercial solid lubricants and self-lubricating composite materials was developed by McMurtrey, E. L., *High Performance Solid and Liquid Lubricants: An Industrial Guide*, pp. 36–75 Noyes Data Corp., Park Ridge, N.J. (1987). He lists a large number of composite materials as high temperature lubricating systems. A large number contain $MoS_2$ as the actual lubricant mixed with other phases. These however are largely applied in a suspension and then cured, with little adherence and relatively short lived.

Zhang, X. H.; Liu, J. J.; Zhu, B. L.; Zhang, X. S. and Liu, H. have described a Ni—$MoS_2$ coating that is brush plated onto surfaces and possesses a low coefficient of friction. Zhang, X. H.; Liu, J. J.; Zhu, B. L.; Zhang, X. S. and Liu, H. (1992), "Microstructure of Ni—$MoS_2$ Composite Solid Lubrication Layer Produced by Brush Plating Method," Lubrication Engineering, 48 (1) p. 37. This coating may be applicable to many of the same uses as the subject invention.

OBJECTS OF THE INVENTION

Accordingly, it is an object of the present invention to provide a new and improved solid lubricant and method thereof.

Further and other objects of the present invention will become apparent from the description contained herein.

SUMMARY OF THE INVENTION

In accordance with one aspect of the present invention, a new and improved multiphase composite lubricant coating has a composition comprising a hard refractory matrix phase dispersed with particles of a solid lubricating phase of molybdenum disulfide.

In accordance with another aspect of the present invention, a new and improved method of preparing an article coated with a multiphase composite lubricant coating on the surface of said article comprises the following steps:

Step 1. An article having a surface is provided.

Step 2. A gaseous mixture of a first metal species, a second metal species of molybdenum hexafluoride, hydrogen sulfide and ammonia is provided.

Step 3. The article having a surface is heated to temperatures between 350° and 850° C. in a reaction vessel at a reduced pressure to form a heated article.

Step 4. The article in Step 3. is exposed to the gaseous mixture of Step 2. forming a multiphase composite coating on the surface of the article.

Figure 1:
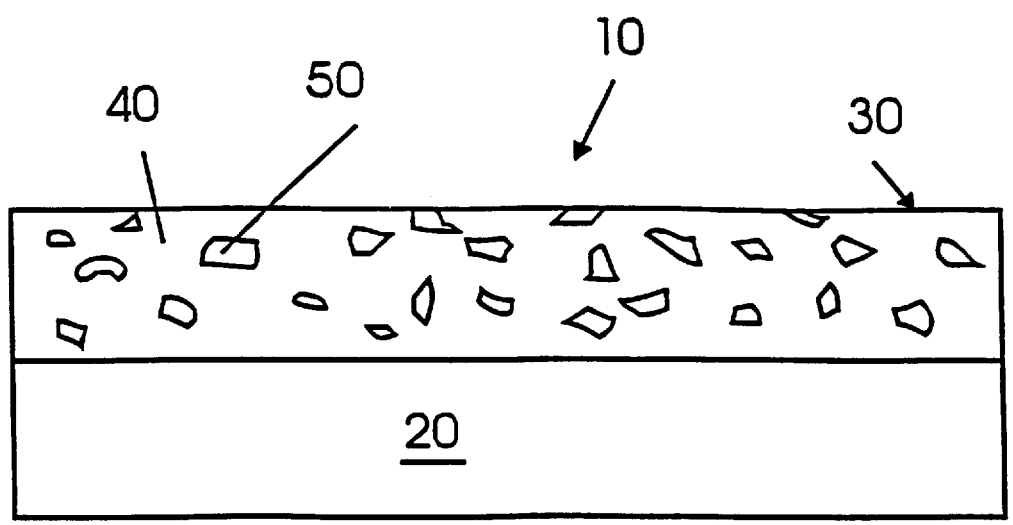
FIG. 1 is a cross-sectional view of an article coated with a multiphase composite lubricant coating in accordance with the present invention.

For a better understanding of the present invention, together with other and further objects, advantages and capabilities thereof, reference is made to the following disclosure and appended claims in connection with the above-described drawing.

DETAILED DESCRIPTION OF THE PREFERRED EMBODIMENTS

The self-lubricating material systems and methods of the present invention offer the greatest potential to solve many of the most demanding tribological problems associated with the development of practical advanced engines. Two important lubrication requirements for advanced engines are failsafe lubrication protection and start-up transient mitigation. To understand why these requirements are often critically important to engine operation and part longevity, it is necessary to recognize that liquid lubricants may only perform satisfactorily when parts are moving within a range of speeds such that sufficient hydrodynamic lift occurs to separate the bearing surfaces. As parts are coming up to speed, idling, or slowing down, liquid lubricant films can break-down leading to solid contact and increased wear. If an engine has been unused for a few hours or days, it may take a few seconds to develop a functional liquid lubricating film and scuffing wear can occur at a significant rate. Therefore, another important function for a self-lubricating surface may be to serve as a wear-preventing safeguard during liquid lubricant loss, and to serve a backup role during momentary transients in engine operation when most wear occurs. High-temperature, gas turbine engines of the future must have such safeguards built into the system and a new generation of self-lubricating materials is thus required. CVD-coating systems developed in this effort are expected to enable the transportation industry to proceed with advanced engine designs which are now limited by tribological problems.

CVD techniques offer the opportunity to create very uniform self-lubricating composite surfaces which slowly wear away to expose pockets of lubricant which then spread across the surface. The key in designing such materials is to provide an adequate supply of solid lubricant, uniformly dispersed in the microstructure, and to assure that the matrix material wears away at the proper rate to supply the lubricant as it is depleted during sliding. Engineered CVD materials, with their high degree of microstructural process control offer remarkable potential for solving these problems, with resulting solutions to many current and future problems in high-temperature lubrication technology.

CVD is a process whereby reactant gases or vapors are allowed to flow over a substrate at elevated temperature where they react, depositing a film or coating. Although the process dates back to the 1920s, it is only with the demands of integrated circuitry and the more sophisticated structural materials requirements of the last two decades that CVD has become a relatively common technique. The process is now a staple of the integrated circuitry industry for depositing nanometer scale coatings, often doped at the ppm level. Multilayer CVD coatings are routinely applied to high performance tool bits to vastly improve their life and machining quality.

The coatings have been prepared by CVD. In this process vapor sources of the constituent elements, either as metal organic compounds or metal halides, and hydrogen sulfide and ammonia mixtures are carried by argon over heated substrates. The substrates are heated to temperatures between 350° and 850° C. The reaction vessel is typically at reduced pressure. Chemical reactions then occur which produce a solid coating on the heated surface containing the constituent elements. Depending on conditions, single-phase coatings such as nitrided molybdenum disulfide, or two-phase coatings such as titanium nitride-molybdenum disulfide are produced.

A self-lubricating composite coating consisting of TiN and $MoS_2$ was deposited on graphite and Ti-6Al-4V substrates by simultaneous deposition from $Ti((CH_3)_2N)_4$, $NH_3$, $MoF_6$, and $H_2S$ gas mixtures. The chemical compositions and microstructures of the coatings were characterized by X-ray diffraction, electron microprobe analysis, Auger electron spectroscopy, and transmission electron microscopy. Friction coefficients of the coatings against type 440C stainless steel were measured both at room temperature and at elevated temperatures, and values <0.2 were obtained. The observed tribological behavior was correlated with coating composition and microstructure.

A multiphase coating comprising a generally continuous hard matrix phase; a generally discontinuous solid lubricant phase; said phases being deposited substantially simultaneously upon a selected substrate by CVD.

The solid hard matrix is a material selected from the group consisting of crystalline titanium nitride, silicon carbide, titanium carbide and can include other hard metal carbides and nitrides.

The solid lubricant is molybdenum disulfide.

The solid phases are prepared by reactive decomposition of metalorganic and halide precursors of the metals and hydrogen sulfide or other sulfur bearing vapor species plus carbon containing vapor species for carbide formation and nitrogen bearing vapor species for nitride formation.

The composition of the coating is within the range of 50 volume-% hard matrix plus 50 volume-% lubricating phase to 90 volume-% hard matrix plus 10 volume-% lubricating phase.

The compositions of the coating through the thickness that can vary with position relative to the substrate surface such that the volume-% of lubricant increases with distance from the substrate surface. Additional compositions include amorphous molybdenum sulfide containing nitrogen prepared by CVD by the same means as described above, although at temperatures sufficiently low as to cause the coating be formed in the noncrystalline state. The composition of this coating is within the range 10 to 30 atomic-% nitrogen, 20 to 40 atomic-% molybdenum, and 30 to 60 atomic-% sulfur.

The method of making the multiphase coating comprises the pyrolysis of a mixture of at least: gaseous source of a first metal species, gaseous source of a second metal species, gaseous source of nitrogen or carbon and a gaseous source of sulfur.

A wear resistant article comprises: a substrate; a multiphase coating comprising a generally continuous hard matrix phase; a generally discontinuous solid lubricant phase; the coating having high hardness and low coefficient of friction.

This coated article provides a lubricating surface for a mating surface of another article having differing velocities. The application of the present invention can be used with a rotating or sliding bearing surface or an article configured such that the coating comprises a bearing surface, a metal working tool or a sealing surface.

Tests of the hardness and friction coefficient of these coatings demonstrate their utility. Knoop hardness values of 6 GPa and friction coefficients below 0.2 have been obtained. These combinations reveal a coating that has high resistance to wear yet a remarkably low friction coefficient of a high temperature material that is not externally lubricated.

An example of a cross sectional view of coated article 10 the present invention is shown in FIG. 1. Coated article 10 comprises article 20 and multiphase composite lubricant coating 30. Multiphase composite lubricant coating 30 comprises hard refractory matrix phase 40 dispersed with particles 50 of a solid lubricating phase of molybdenum disulfide. The hard refractory matrix phase 40 can be any hard refractory material which can be deposited by CVD. Examples of such a material are titanium nitride, silicon carbide and titanium carbide and combinations thereof. Hard refractory matrix phase 40 has a grain size of about 50 nanometers. Particles 50 of the solid lubricating phase of molybdenum disulfide have a particle size of about 10 nanometers. The composition of multiphase composite lubricant coating 30 comprises about 50 volume % to about 90 volume % of hard refractory matrix phase 40 and the remainder being particles 50 of the solid lubricating phase of molybdenum disulfide.

A specific example of the present invention is the deposition of a composite coating of TiN—$MoS_2$ on a polished Ti-6Al-4V alloy substrate. The deposition of the composite coating of TiN—$MoS_2$ was carried out on polished Ti-6Al-4V alloy substrates in a cold-wall CVD reactor at 1073 K and a system pressure of 5.3 kPa. The precursor gases were composed of tetrakis (dimethylamino) titanium, $Ti((CH_3)_2N)_4$, (99.9%, Strem Chemicals, Inc., Newburyport, Mass.), $MoF_6$ (99.9%, Johnson Matthey, Wardhill, Mass.), $NH_3$ (99.95%, Alphagaz, Morrisville, Pa.), and $H_2S$ (99.5%, Alphagaz). The reaction chamber, constructed of a fused silica tube, was 61 cm long and 3.3 cm in inner diameter. Stainless steel flanges with compression 0-ring fittings were used to seal the reactor assembly at both ends. Mass flow controllers were used to control gas flows, and the system pressure was controlled by using a mechanical pump with a solenoid flow valve coupled with a pressure controller and a capacitance manometer. 150 g of $Ti((CH_3)_2N)_4$ was contained in a 200-$cm^3$ bubbler maintained at a constant temperature of 338K using a silicon oil bath with an immersion circulator. The vapor pressure of $Ti((CH_3)_2N)_4$ at this temperature is approximately 200 Pa. Argon at 20 $cm^3$/min at STP was passed through the bubbler to carry the vapor into the reactor. The flow rate of $NH_3$ was 300 $cm^3$/min which was separately fed into the reaction zone using a dual-path, co-axial Inconel injector to prevent premature reaction with the precursors. The flow rates of $MoF_6$ and $H_2S$ were 6 and 60 $cm^3$/min, respectively. The Ti alloy substrates (1.8 cm×2.5 cm) were placed on a 13-cm long graphite susceptor which was inductively heated by a radio frequency generator (164 kHz). A K-type thermocouple in contact with the graphite susceptor was used to measure temperature. Coating thicknesses of 3–4 $\mu$m were produced.

While there has been shown and described what is at present considered the preferred embodiments of the invention, it will be obvious to those skilled in the art that various changes and modifications may be made therein without departing from the scope of the invention as defined by the appended claims.

What is claimed is:

1. A method of preparing an article coated with a multiphase composite lubricant coating on the surface of said article comprising the following steps:

Step 1. providing an article having a surface;

Step 2. providing a gaseous mixture of a first metal species, a second metal species of molybdenum hexafluoride, hydrogen sulfide and ammonia;

Step 3. heating said article having said surface to temperatures between 350° C. and 850° C. in a reaction vessel at a reduced pressure to form a heated article;

Step 4. exposing said article in Step 3. to said gaseous mixture of Step 2. depositing substantially simultaneously a hard matrix phase and a discontinuous solid lubricant phase forming a multiphase composite coating on said surface of said article.

2. A method of preparing an article coated with a multiphase composite lubricant coating on the surface of said article in accordance with claim 1 wherein said first metal species is $Ti((CH_3)_2N)_4$.

* * * * *